(12) United States Patent
Kang et al.

(10) Patent No.: US 11,026,355 B2
(45) Date of Patent: Jun. 1, 2021

(54) HOUSING FOR RECEIVING ELECTRONIC DEVICES AND ELECTRONIC SYSTEM HAVING THE SAME

(71) Applicant: Samsung Electronics Co., Ltd., Suwon-si (KR)

(72) Inventors: Hee-Won Kang, Hwaseong-si (KR); Nam-Su Kim, Suwon-si (KR); In-Hyuk Ko, Suwon-si (KR); Eun-Ji Moon, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/444,499

(22) Filed: Jun. 18, 2019

(65) Prior Publication Data

US 2020/0196495 A1    Jun. 18, 2020

(30) Foreign Application Priority Data

Dec. 18, 2018    (KR) .......................... 10-2018-0163945

(51) Int. Cl.
*H05K 5/00* (2006.01)
*H05K 9/00* (2006.01)
(Continued)

(52) U.S. Cl.
CPC ......... *H05K 9/0022* (2013.01); *H05K 1/0215* (2013.01); *H05K 1/181* (2013.01); *H05K 5/006* (2013.01); *H05K 5/0052* (2013.01); *H05K 5/0247* (2013.01); *H05K 2201/10159* (2013.01); *H05K 2201/10522* (2013.01); *H05K 2201/10734* (2013.01)

(58) Field of Classification Search
USPC ......................................................... 361/753
See application file for complete search history.

(56) References Cited

U.S. PATENT DOCUMENTS 4,370,515 A    1/1983  Donaldson
4,831,498 A *  5/1989  Baba .................... H05K 9/0033
                                                174/356

(Continued)

FOREIGN PATENT DOCUMENTS

JP    2003-318297 A    11/2003
KR      101478721 B1    1/2015

*Primary Examiner* — Hung S. Bui
(74) *Attorney, Agent, or Firm* — Harness, Dickey & Pierce, P.L.C.

(57) ABSTRACT

Disclosed are a housing for receiving an electronic device and an electronic system having the same. The electronic system includes a case having lower and upper cases detachably combined with the lower case, a circuit board arranged in an inner space of the case and secured to the lower case such that at least a grounding line and at least a connection line are provided with the circuit board, a plurality of devices arranged on the circuit board such that each device is separated from one another by the grounding line and is connected with one another by the connection line, and at least an electromagnetic shielding member embedded onto the upper case such that the electromagnetic shielding member is in contact with the grounding line around the device to provide a shielding space receiving the device. The device is protected from unexpected electromagnetic waves by the electromagnetic shielding member.

13 Claims, 7 Drawing Sheets

(51) Int. Cl.
  *H05K 1/02* (2006.01)
  *H05K 5/02* (2006.01)
  *H05K 1/18* (2006.01)

(56) References Cited

U.S. PATENT DOCUMENTS

| | | | | |
|---|---|---|---|---|
| 5,557,063 A * | 9/1996 | Mottahed | ............. | H05K 9/0035 |
| | | | | 174/373 |
| 6,392,900 B1 | 5/2002 | Petty et al. | | |
| 6,490,438 B1 * | 12/2002 | Wu | ...................... | H04B 1/3833 |
| | | | | 361/816 |
| 6,538,196 B1 * | 3/2003 | MacDonald | ......... | H05K 7/1417 |
| | | | | 174/363 |
| 6,566,596 B1 * | 5/2003 | Askew | ................ | H01L 23/3135 |
| | | | | 174/391 |
| 7,085,142 B2 | 8/2006 | Berberich | | |
| 7,095,624 B2 | 8/2006 | Daoud et al. | | |
| 7,145,084 B1 * | 12/2006 | Sarihan | ................. | H01L 23/041 |
| | | | | 174/361 |
| 7,326,862 B2 * | 2/2008 | Lionetta | ................. | H05K 9/003 |
| | | | | 174/370 |
| 7,518,880 B1 * | 4/2009 | Ziberna | ................ | H05K 9/0084 |
| | | | | 174/350 |
| 7,626,832 B2 * | 12/2009 | Muramatsu | .......... | H05K 9/0069 |
| | | | | 361/816 |
| 7,813,145 B2 * | 10/2010 | Stoneham | ............ | H05K 9/0024 |
| | | | | 361/752 |
| 8,076,592 B2 * | 12/2011 | Lin | ...................... | H05K 9/0039 |
| | | | | 174/359 |
| 8,178,956 B2 | 5/2012 | Do et al. | | |
| 8,446,739 B2 * | 5/2013 | Harikae | ................ | H01L 21/563 |
| | | | | 361/816 |
| 9,048,124 B2 * | 6/2015 | Dolci | .................... | H01L 23/553 |
| 9,167,734 B2 * | 10/2015 | Bopp | ..................... | H05K 7/142 |
| 9,966,677 B2 | 5/2018 | Tziviskos et al. | | |
| 2006/0060953 A1 * | 3/2006 | Yang | ....................... | H01L 23/10 |
| | | | | 257/678 |
| 2007/0211436 A1 * | 9/2007 | Robinson | ............... | H01L 23/552 |
| | | | | 361/719 |
| 2008/0102701 A1 | 5/2008 | Suzuki et al. | | |
| 2018/0240759 A1 | 8/2018 | Haji-Rahim et al. | | |
| 2019/0357347 A1 * | 11/2019 | Kim | ..................... | H05K 1/0222 |

* cited by examiner

HOUSING FOR RECEIVING ELECTRONIC DEVICES AND ELECTRONIC SYSTEM HAVING THE SAME

CROSS-REFERENCE TO RELATED APPLICATIONS

This application claims priority under 35 U.S.C. § 119 to Korean Patent Application No. 10-2018-0163945 filed on Dec. 18, 2018 in the Korean Intellectual Property Office, the disclosure of which is incorporated by reference herein in its entirety.

BACKGROUND

1. Field

Example embodiments relate to a housing for receiving electronic devices and an electronic system having the same, and more particularly, to a housing for receiving electronic devices having an improved radiation susceptibility and an electronic system having the same.

2. Description of the Related Art

Various electromagnetic shielding members are generally provided with various recent electronic systems. Thus, the electronic system can be protected from specific electromagnetic waves by the electromagnetic shielding member and neighboring electronic systems can avoid electromagnetic interference with each other by the electromagnetic shielding member. For example, a plurality of shield cans is provided with the electronic system in such a way that each component of the electronic system is individually covered by the shield can for reducing or preventing electromagnetic damages caused by ambient electromagnetic waves.

However, the electromagnetic damages to the electronic system caused by unexpected electromagnetic waves cannot be reduced or prevented by the electromagnetic shielding members, such as the shield can. The ambient electromagnetic waves are classified into expected electromagnetic waves that may be usually expectedly generated and sufficiently prepared in a device design of the electronic system and unexpected electromagnetic waves that may be unexpectedly generated and be difficult to prepare in a device design of the electronic system. The unexpected electromagnetic waves may be selectively and specifically generated according to usage environments and configuration specifications of the electronic system, and thus the electromagnetic damages caused by the unexpected electromagnetic waves are difficult to reduce or prevent in the electronic system.

For example, radiated noises are selectively generated in a system test for the electronic system according to the characteristics of the system test and various components of the electronic system are damaged by the test-independent radiation noises. When a SSD server system is constructed by using a plurality of solid state drive (SSD) devices sufficiently satisfying International Standards for the electromagnetic shielding, an electrostatic shielding (ESD) test is conducted to each SSD device of the SSD server system for estimating the ESD characteristics of each SSD device. A test signal for the ESD test is generated from an ESD gun that may be arranged out of the SSD server system and the test signal may be individually applied to each of the SSD devices for an individual ESD test to each SSD device. In the ESD test to each SSD device, unexpected radiated noises may be generated from the ESD gun due to the switching operation of the ESD gun and may spread out into a housing of the SSD server system. The radiated noises usually cause operation failures of each SSD device of the SSD server system in spite of sufficient ESD characteristics.

The specific electromagnetic waves such as the radiated noises are selectively, irregularly and specifically generated according to the environments, the configurations and the operation characteristics of the SSD server system. Thus, a standard shielding member for protecting the radiated noises of the ESD gun cannot be provided with the SSD device in manufacturing processes for the SSD device since the electromagnetic damages to the SSD device caused by the radiated noises may be generated or not be generated according to the environments and configurations of the SSD server system including the SSD devices. That is, no standard shielding members can be provided for reducing or preventing the electromagnetic damages caused by the specific electromagnetic waves in manufacturing processes for the component devices of the electronic system.

SUMMARY

Example embodiments of the present inventive concepts provide an improved electronic system of which the component devices can be protected from specific electromagnetic waves, which are generated after the manufacture of the component devices and the electronic system, without any additional processes to a system board of the electronic system.

Example embodiments of the present inventive concepts provide a housing for receiving electronic devices to which at least an electromagnetic shielding member is embedded for shielding unexpected electromagnetic waves.

Other example embodiments of the present inventive concepts provide an electronic system having a plurality of electronic devices in the above housing.

According to example embodiments of the inventive concepts, there is provided a housing configured to receive electronic devices including a case having an inner space in which a board is received such that at least a grounding line extends on the board, and an electromagnetic shielding member embedded onto an inner surface of the case such that the electromagnetic shielding member may be contact with the grounding line to thereby provide a shielding space defined by the board and the electromagnetic shielding member. The shielding space may be shielded from electromagnetic waves by the electromagnetic shielding member.

According to example embodiments of the inventive concepts, there is provided an electronic system including a case having a lower case and an upper case detachably combined with the lower case, a circuit board in an inner space of the case and secured to the lower case such that at least one grounding line and at least one connection line may be provided with the circuit board, a plurality of devices arranged on the circuit board such that each device may be separated from one another by the at least one grounding line and may be connected with one another by the at least one connection line, and at least an electromagnetic shielding member embedded onto the upper case such that the electromagnetic shielding member may be in contact with the at least one grounding line around the plurality of devices to thereby provide a shielding space receiving the plurality of devices. The plurality of devices may be protected from electromagnetic waves by the electromagnetic shielding member.

According to example embodiments of the inventive concepts, the circuit board having a plurality of the devices may be positioned in the case and the electromagnetic shielding members may be embedded into the case in one body in such a configuration that the electromagnetic shielding members may individually enclose the devices with the respective shielding spaces. The electromagnetic shielding members may be automatically arranged along the grounding line on the board when the upper case may be combined to the lower case.

Accordingly, the devices may be sufficiently protected from the unexpected electromagnetic waves in the test to the electronic system just by combining the lower case and the upper case without any further shielding processes to the board and the devices.

In addition, a plurality of the recesses may be arranged at an end portion of the electromagnetic shielding member without deterioration of the electromagnetic shielding characteristics, to thereby improving the space efficiency of the board in the electronic system. The size of the recess may be determined in view of the wavelength of the specific electromagnetic waves.

Further, the operation heat of the devices on the board may also be dissipated outwards from the shielding space through the recess, thereby improving the heat dissipation characteristics of the electronic system.

BRIEF DESCRIPTION OF THE DRAWINGS

These and other features of the inventive concepts will become more apparent by describing in detail example embodiments thereof with reference to the accompanying drawings of which.

DETAILED DESCRIPTION OF EMBODIMENTS

Figure 1:
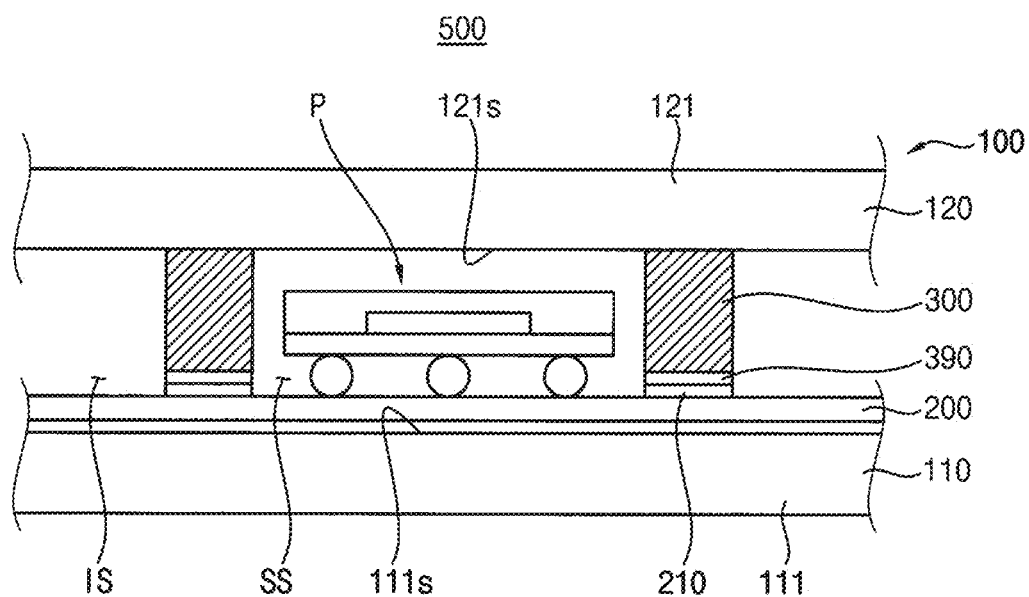
FIG. 1 is a cross sectional view illustrating a housing for receiving electronic devices in accordance with an example embodiment of the present inventive concepts.

Reference will now be made to example embodiments, which are illustrated in the accompanying drawings, wherein like reference numerals may refer to like components throughout.

Figure 2:
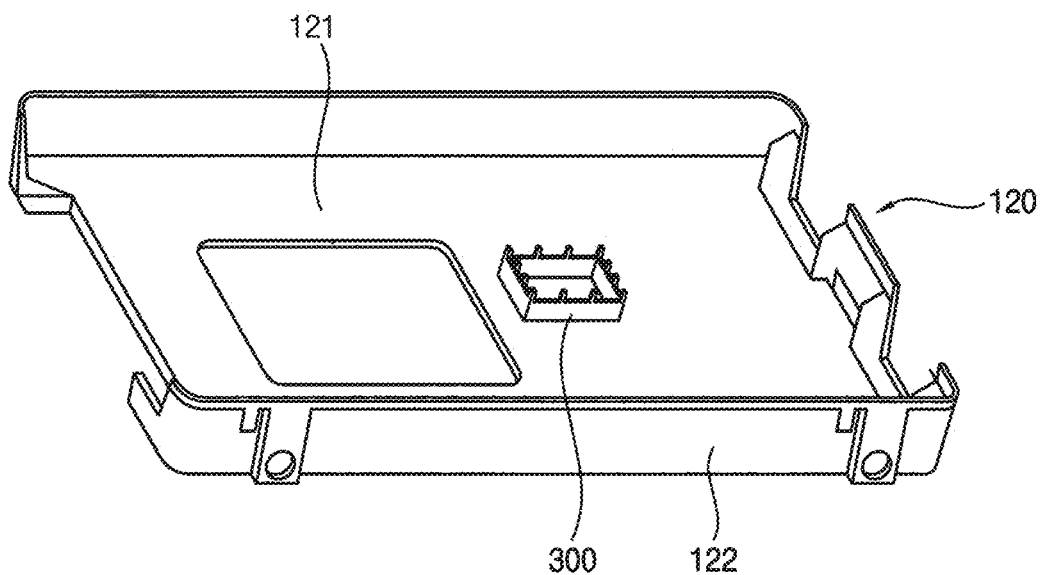
FIG. 2 is a perspective view illustrating an upper case and an electromagnetic shielding member of the housing shown in FIG. 1.

FIG. 1 is a cross sectional view illustrating a housing for receiving electronic devices in accordance with an example embodiment of the present inventive concepts. FIG. 2 is a perspective view illustrating an upper case and an electromagnetic shielding member of the housing shown in FIG. 1.

Referring to FIGS. 1 and 2, a housing 500 for receiving electronic devices in accordance with an example embodiment of the present inventive concepts may include a case 100 having an inner space IS in which a board 200 is received such that at least a grounding line 210 may extend on the board 200, and an electromagnetic shielding member 300 embedded onto an inner surface of the case 100 such that the electromagnetic shielding member 300 may be contact with the grounding line 210 to thereby provide a shielding space SS defined by the board 200 and the electromagnetic shielding member 300. The shielding space SS may be shielded from electromagnetic waves by the electromagnetic shielding member 300.

For example, the case 100 may include a 3-dimensional structure having the inner space IS in which the board 200 may be received and may have sufficient strength and/or rigidity for protecting the board 200 from external forces. The 3-dimensional structure may have various shapes and configurations in accordance with the requirements and configurations of an electronic system having the housing 500. For example, the 3-dimensional structure may be shaped into a cylinder structure or a polygonal prism structure.

The 3-dimensional structure may have a uniform cross sectional shape such as the cylinder structure in which the cross sectional shape is uniform along a height of the cylinder structure. In contrast, the 3-dimensional structure may have a non-uniform cross sectional shape such as a composite structure in which at least two different structures may be combined with each other.

In example embodiments, the case 100 may include a lower case 110 to which the board 200 may be secured and an upper case 120 detachably combined to the lower case 110 such that the inner space IS may be defined by the lower case 110 and the upper case 120. The electromagnetic shielding member 300 may be embedded to the upper case 120.

The lower case 110 may include a first plate 111 having a first flat surface 111s and a first sidewall (not shown) protruding from the first plate 111 upwards and the upper case 120 may include a second plate 121 having a second flat surface 121s and a second sidewall 122 protruding from the second plate 121 downwards. The lower case 110 and the upper case 120 may be combined with each other in such a configuration that the first flat surface 111s may face the second flat surface 121s and the first sidewall may be combined to the second sidewall 122.

Thus, the lower case 110 and the upper case 120 may be combined into the case 100 and the space defined by the first and the second flat surfaces 111s and 121s and by the first sidewall and the second sidewall 122 may be provided as the inner space IS of the case 100 that may be separated from the surroundings.

As will be described in detail, the board 200 may be secured to the lower case 110 and the electromagnetic shielding member 300 may be embedded to the upper case 120.

The board 200 may include a circuit board in which a plurality of electric circuits may be provided, so various electric signals may be transferred through the board 200. For example, the board 200 may include a printed circuit board (PCB).

Various passive devices and active devices may be mounted on the board 200. For example, a plurality of semiconductor memory packages P such as DRAM devices and NAND memory devices and various logic devices may be mounted on the board 200. In addition, various passive devices such as a controller chip for controlling the memory packages P and the logic chip and a capacitor may also be mounted on the board 200. The active devices and the passive devices may be systematically organized into a single electronic device. Thus, the functions and configurations of the electronic device may be determined by the active devices and the passive devices on the board 200.

At least one grounding line 210 may be arranged on the board 200 and the potential difference or the voltage between the lower case 110 and the board 200 may be set zero by the grounding line 210. For example, the grounding line 210 may be connected to a grounding wire (not shown) of the board 200. The grounding line 210 may have various configurations according to the configurations of the board 200 and may be connected to the grounding wire by a direct connection or an indirect connection by using a re-directional line (not shown).

The board 200 may be secured to the lower case 110 by a securing member (not shown). Various securing members may be used for securing the board to the lower case 110. For example, a plurality of the securing members may be locally positioned around a peripheral portion of the board 200 as well as a central portion of the board 200.

For example, the grounding line 210 may be arranged on the board 200 in such a configuration that each of the active devices and the passive devices may be individually enclosed by the ground line 210. The electromagnetic shielding member 300 may be arranged along the grounding line 210 for protecting the electronic devices from the electromagnetic waves.

The electromagnetic shielding member 300 may be embedded into the upper case 120 and may protrude from the second flat surface 121s. When the upper case 120 may be combined to the lower case 110, the electromagnetic shielding member 300 may make contact with the grounding line 210 to thereby form a shielding space SS defined by the electromagnetic shielding member 300 and the first and the second flat surfaces 111s and 121s.

Figure 3A:
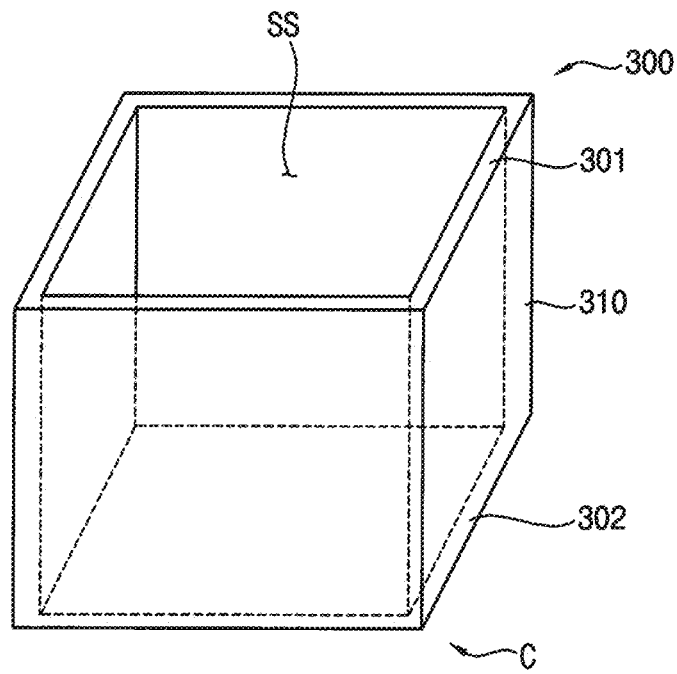
FIG. 3A is a perspective view illustrating the electromagnetic shielding member shown in FIG. 2.
Figure 3B:
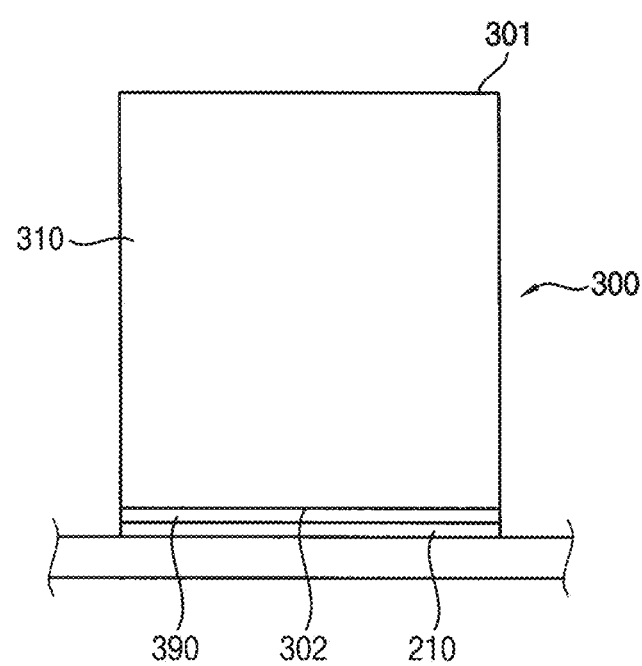
FIG. 3B is a side view illustrating the combination of the electromagnetic shielding member shown FIG. 3A and the board shown in FIG. 1.

FIG. 3A is a perspective view illustrating the electromagnetic shielding member shown in FIG. 2 and FIG. 3B is a side view illustrating the combination of the electromagnetic shielding member shown FIG. 3A and the board shown in FIG. 1.

Referring to FIGS. 3A and 3B, the electromagnetic shielding member 300 may include a hollow rectangular cube C extending downwards from the second flat surface 121s. Thus, the electromagnetic shielding member 300 may include four vertical plates 310 enclosing the shielding space SS.

For example, the vertical plate 310 may be integrally provided with the upper case 120 in one body and may extend downwards from the upper case 120 towards the lower case 110. A first end portion 301 of the vertical plate 310 may be integrally connected to the second flat surface 121s and a second end portion 302 of the vertical plate 310 opposite to the first end portion 301 may make contact with the grounding line 210.

The neighboring vertical plates 310 may be integrally connected with each other, so that shielding space SS may be closed by the first and the second flat surfaces 111s and 121s and the four vertical plates 310. Thus, the shielding space SS may be provided as a closed space in the case 100.

When ambient electromagnetic waves may be generated around the electromagnetic shielding member 300, the electromagnetic waves may be restricted from passing into the shielding space SS by the electromagnetic shielding member 300 and thus the electronic devices in the shielding space SS may be sufficiently protected from the ambient electromagnetic waves. The ambient electromagnetic weaves may induce electrical currents in the electromagnetic shielding member 300 and may be transformed into the induced currents in the electromagnetic shielding member 300 instead of penetrating through the electromagnetic shielding member 300. The induced currents in the electromagnetic shielding member 300 may pass to the lower case 110 through the grounding line 210. Therefore, the electronic device in the shielding space SS may be sufficiently protected from the ambient electromagnetic waves by the electromagnetic shielding member 300.

In a modified example embodiment, a conductive adhesive 390 may be further provided between the grounding line 210 and the second end portion 302 of the vertical plate 310 of the electromagnetic shielding member 300.

The conductive adhesive 390 may be coated on or adhered to the second portion of the vertical plate 310 and may strengthen the adhesion of the vertical plate 310 and the grounding line 210 with good electrical conductivity. Thus, the induced currents in the electromagnetic shielding member 300 may be sufficiently discharged through the grounding line 210.

The electromagnetic shielding member 300 may be selectively and locally arranged on the board 200 in such a configuration that the electronic devices which may be relatively more vulnerable to the ambient electromagnetic waves and require electromagnetic shielding (hereinafter, referred to vulnerable devices) may be enclosed by the electromagnetic shielding member 300. Thus, the layout of the electromagnetic shielding member 300 may be similar to the distribution of the vulnerable devices on the board 200. Accordingly, the combination of the upper case 120 to the lower case 110 may assure the arrangement of the vertical plate 310 around the vulnerable devices in such a way that the conductive adhesive 390 on the second end portion of the vertical plate 310 may be adhered to the grounding line 210 enclosing the vulnerable devices.

Therefore, the electromagnetic shielding member 300 may be conductively adhered to the grounding line 210 on the board 200 and thus the induced currents in the electromagnetic shielding member 300 may be sufficiently discharged away to the surroundings.

In example embodiments, the conductive adhesive 390 may include any one of a copper film, a soldering clip and a conductive gasket. However, any other materials and members may also be used as the conductive adhesive as long as the electromagnetic shielding member 300 may be sufficiently combined to the grounding line 210 on the board 200.

While example embodiments disclose a single vulnerable device having the memory package P and a single electromagnetic shielding member 300 enclosing the vulnerable device, a plurality of the vulnerable devices may also be arranged on the board 200 and thus a plurality of the electromagnetic shielding member 300 may be arranged in such a way that the vulnerable devices may be individually enclosed by the electromagnetic shielding member 300.

The electronic device may be manufactured in an additional manufacturing process and may have sufficient electromagnetic shielding characteristics. Thus, the ambient electromagnetic waves that may be expectedly generated around the electronic device may be sufficiently protected from the expected electromagnetic waves. However, when the electronic device having sufficient electromagnetic shielding characteristics against the expected electromagnetic waves may be installed on the board 200 and may be configured into an electronic system, the unexpected electromagnetic waves may be generated around the electronic system according to the environmental conditions, configurations and operational characteristics of the electronic system. Thus, the electronic device is necessarily vulnerable to the unexpected electromagnetic waves and the electromagnetic shielding characteristics against the unexpected electromagnetic waves cannot be designed or considered in the manufacturing process for the electronic device. However, since the electromagnetic shielding member 300 may be always provided together with the case 100 in one body, the electronic device may be sufficiently protected from the unexpected electromagnetic waves by the electromagnetic shielding member 300 in the electronic system having the electronic device.

The distribution of the vulnerable devices on the board 200 may be varied according to the electronic device. Thus, the electromagnetic shielding member 300 may be formed in a case formation process in such a way that the electromagnetic shielding member 300 may be arranged on the second flat surface 121s along the layout of the distribution of the vulnerable devices and each of the vulnerable device may be received in the respective shielding space SS.

Thus, the electronic devices may be manufactured in no consideration of the unexpected electromagnetic waves by a device manufacturer and a system manufacturer may form the case 100 to which the electromagnetic shielding member 300 may be embedded. The system manufacturer may buy the electronic devices, which are sufficiently protected from the expected electromagnetic waves, from the device manufacturer and may be mounted on the board 200 in the case 100. The electromagnetic shielding member 300 may be arranged around the vulnerable devices and the vulnerable device may be received in the shielding space SS of electromagnetic shielding member 300. Accordingly, the electronic device may be sufficiently protected from the unexpected electromagnetic waves without any further shielding processes to the board 200 and the electronic devices.

The electromagnetic shielding member 300 may be variously modified according to the space efficiency of the case 100 and the reflection characteristics of the unexpected electromagnetic waves.

Figure 4A:
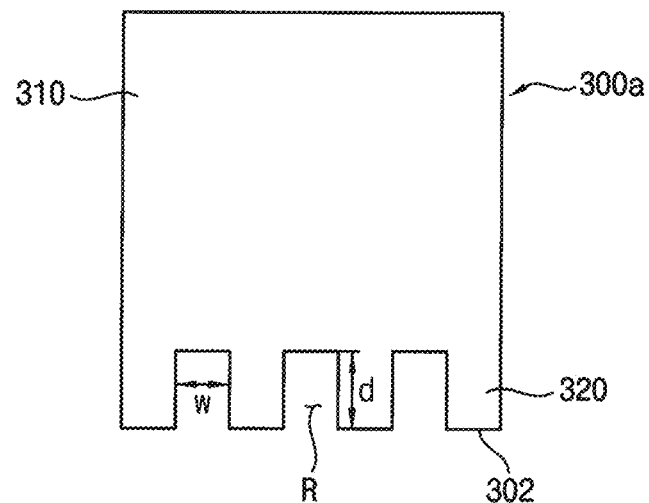
FIG. 4A is a side view illustrating a first modification of the electromagnetic shielding member shown in FIG. 3A.
Figure 4B:
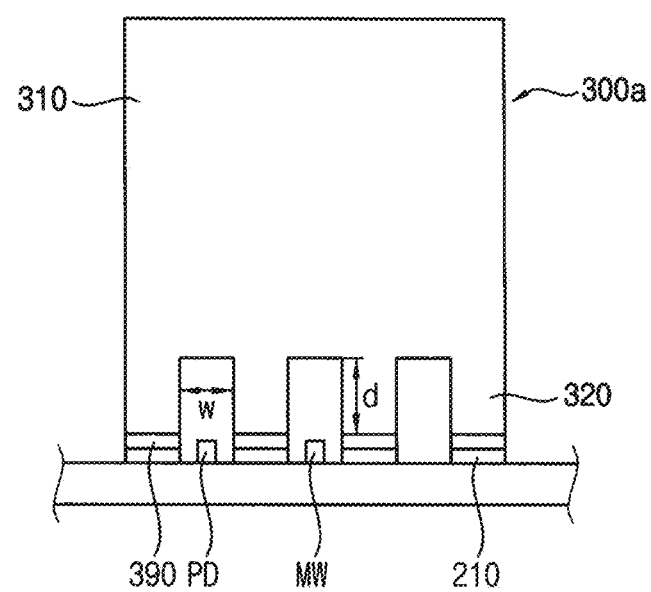
FIG. 4B is a side view illustrating the combination of the first modified electromagnetic shielding member shown FIG. 4A and the board shown in FIG. 1.

FIG. 4A is a side view illustrating a first modification of the electromagnetic shielding member shown in FIG. 3A and FIG. 4B is a side view illustrating the combination of the first modified electromagnetic shielding member shown FIG. 4A and the board shown in FIG. 1. The first modified electromagnetic shielding member 300a in FIG. 4A may have substantially the same structures as the electromagnetic shielding member 300 shown in FIGS. 3A and 3B, except for recesses and protrusions at the second portion of the electromagnetic shielding member 300. Thus, in FIGS. 4A and 4B, the same reference numerals denote the same elements in FIGS. 3A and 3B.

Referring to FIGS. 4A and 4B, the first modified electromagnetic shielding member 300a may include the hollow rectangular cube C extending downwards from the second flat surface 121s of the upper case 120 and having a plurality of recesses R and protrusions 320 that may be alternately arranged at the second end portion 302 along a circumferential line of the hollow rectangular cube C.

The hollow rectangular cube C of the first modified electromagnetic shielding member 300a may also include four vertical plates 310 like the electromagnetic shielding member 300 and the recesses R and the protrusions 320 may be alternately arranged at the second end portion 302 of the vertical plate 310 along the circumferential line of the cube C.

The recess R may be defined by a width w along the circumferential line and a depth d from a surface of the second end portion 302 along a height of the cube C. In example embodiments, the width w may be set smaller than a latitudinal length of each vertical plate 310 and neighboring recesses R may be spaced apart at each vertical plate 310. Thus, each of the vertical plate 310 may have the arrangement of the recess R and the protrusion 320, and thus the recesses R and the protrusions 320 may be uniformly arranged in the circumferential line of the cube C.

Thus, the vertical plate 310 may not be contact with the grounding line 210 at the recess R and may be contact with the grounding line 210 at the protrusion 320, and the contact between the vertical plate 310 and the grounding line 210 may be alternately repeated along the circumferential line of the cube C. That is, the vertical plate 310 may make discontinuous contact with the grounding line 210 along the circumferential line of the cube C. In addition, the shield space SS defined by the first modified electromagnetic shielding member 300a may be communicated with surroundings through the recess R, so the shield space SS may be provided as an open space.

The width w and the depth d of the recess R may be varied according to a wavelength of the unexpected electromagnetic waves and the electromagnetic damages to the electronic device caused by the unexpected electromagnetic waves.

When at least one of the width w and the depth d may be in a range of about ⅟50 times to about ⅟20 times the wavelength of the unexpected electromagnetic waves, the electronic device in the shielding space SS may be more sufficiently protected from the unexpected electromagnetic waves and the electromagnetic damages to the electronic device may be minimized. Thus, the width w and the depth d of the vertical plate 310 may be determined by the following equations (1) and (2).

$$w = \left(\frac{1}{50} \sim \frac{1}{20}\right)\lambda \quad (1)$$

(wherein λ denotes the wavelength of the unexpected electromagnetic waves).

$$d = \left(\frac{1}{50} \sim \frac{1}{20}\right)\lambda \quad (2)$$

(wherein λ denotes the wavelength of the unexpected electromagnetic waves).

In example embodiments, both of the width w and the depth d may be in a range of about 1/50 times to about 1/20 times the wavelength of the unexpected electromagnetic waves. When the unexpected electromagnetic waves may include the radiated noises that are generated from an ESD gun in a frequency of about 1.5 GHz to about 3.0 GHz for the electrostatic shielding (ESD) test, the width w and the depth d may be in a range of about 1/50 times to about 1/20 times of about 10 cm corresponding to the wavelength of the maximal frequency of about 3.0 GHz. Accordingly, the recess R of the first modified electromagnetic shielding member 300a may have the width w and the depth d of about 2 mm to about 5 mm.

For example, no grounding line 210 may be provided on the board 200 corresponding to the recess R of the vertical plate 310, so the board 200 may be exposed in the recess R of the vertical plate 310. Since the vertical plate 310 may be contact with the grounding line 210 at the protrusion 320 with being spaced apart by the width w of the recess R, the grounding line 210 may be discontinuously arranged along the circumferential line of the cube C. That is, the grounding line 210 may be modified into a plurality of grounding points 210a.

Accordingly, the surface of the board 200 may be partially exposed along the recesses R of the vertical plate 310, thereby improving the space efficiency of the electronic device. A further functional unit may be positioned on the board 200 corresponding to the recess R without any deterioration of the electromagnetic shielding characteristics as compared as the electromagnetic shielding member 300 as shown in FIGS. 3A and 3B. For example, further passive devices PD such as a capacitor and a reactance unit may be arranged on the board 200 corresponding to the recess R of the vertical plate 310, so more devices may be arranged on the same board 200. In contrast, a metal wiring MW connected to the memory package P may be arranged on the board 200 corresponding to the recess R of the vertical plate 310 and may extend to surroundings from the shielding space SS through the space of the recess R, thereby improving the routing efficiency of the electronic device.

In addition, the operation heat of the memory package P may also be emitted from the shielding space SS through the recesses R of the first modified electromagnetic shielding member 300a, thereby improving the heat dissipation characteristics of the electronic device.

Figure 5A:
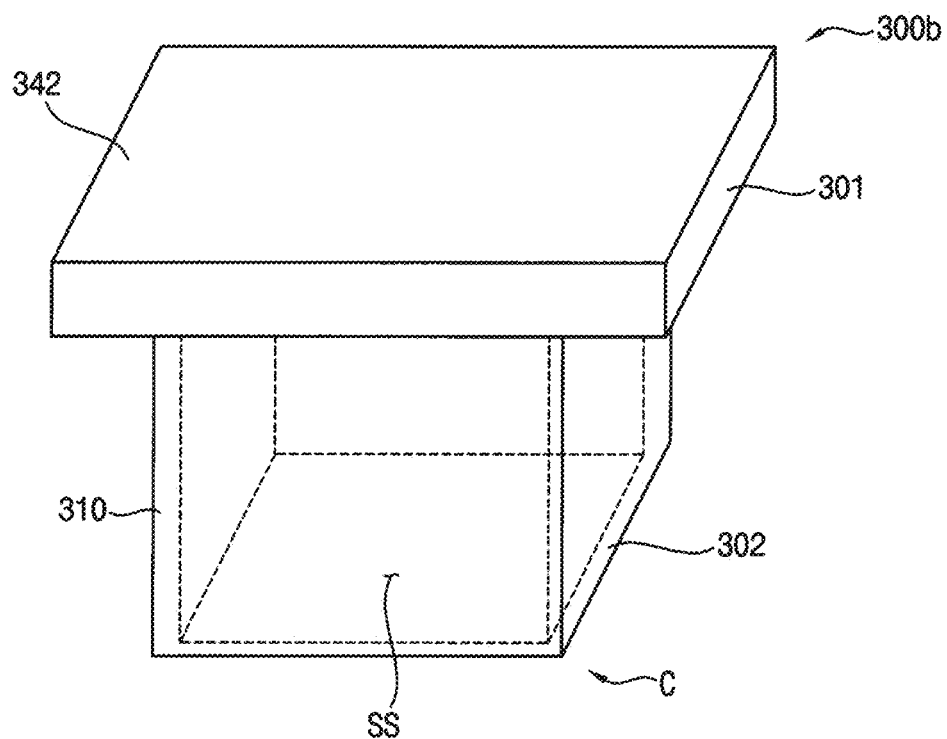
FIG. 5A is a perspective view illustrating a second modification of the electromagnetic shielding member shown in FIG. 3A.
Figure 5B:
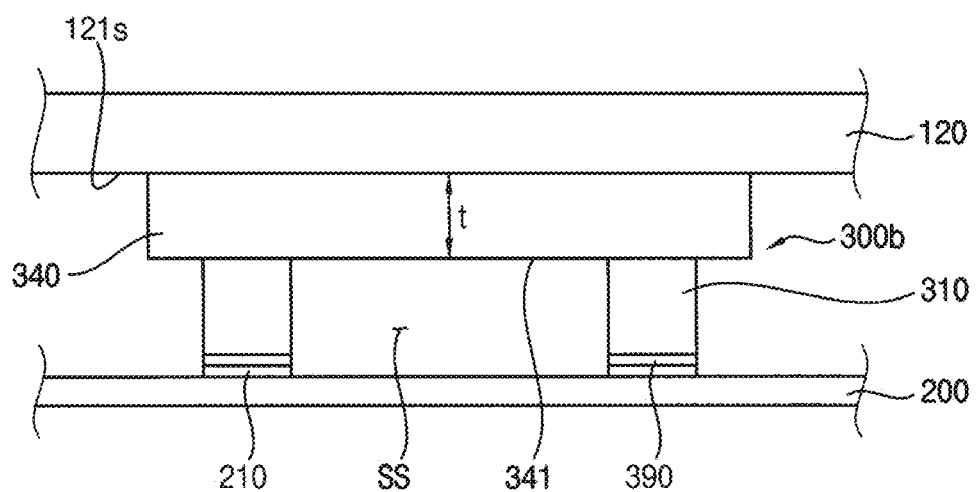
FIG. 5B is a cross sectional view illustrating the combination of the second modified electromagnetic shielding member shown FIG. 5A and the board shown in FIG. 1.

FIG. 5A is a perspective view illustrating a second modification of the electromagnetic shielding member shown in FIG. 3A and FIG. 5B is a cross sectional view illustrating the combination of the second modified electromagnetic shielding member shown FIG. 5A and the board shown in FIG. 1. The second modified electromagnetic shielding member 300b in FIG. 5A may have substantially the same structures as the electromagnetic shielding member 300 shown in FIGS. 3A and 3B, except for a body interposed between the upper case 120 and the vertical plates 310. Thus, in FIGS. 5A and 5B, the same reference numerals denote the same elements in FIGS. 3A and 3B.

Referring to FIGS. 5A and 5B, the second modified electromagnetic shielding member 300b may include a body 340 interposed between the upper case 120 and the vertical plates 310 and shaped into a flat plate.

The body 340 may have such a large size that the hollow rectangular cube C may be covered by the body 340 and may have a sufficient thickness t for reducing or preventing the electromagnetic waves from passing into the shielding space SS. A first body surface 341 may be integrally connected with the vertical plate 310 in one body and a second body surface 342 may be integrally connected with the upper case 120 in one body. For example, the vertical plates 310 may be connected to a peripheral portion of the body 340 and the shielding space SS of the second modified electromagnetic shielding member 300b may be arranged at a central portion of the body 340.

Accordingly, the second modified electromagnetic shielding member 300b may include a body 340 shaped into a flat plate and secured to the upper case 120 and the vertical plates 310 extending downwards from the peripheral portion of the first body surface 341 and defining the shielding space SS.

The body 340 may reflect or refract the electromagnetic waves and may reduce or prevent the specific electromagnetic wave from radiating into the shielding space SS, thereby improving the electromagnetic shielding efficiency with regard to the electronic device. That is, the electronic device may be protected from the electromagnetic waves by the body 340 as well as the vertical plates 310. The electromagnetic waves refracted from the body 340 may be converted into induced currents in the body 340 and the induced currents may be grounded by the vertical plate 310 and the grounding line 200.

In addition, the body 340 may be modified in such a configuration that the body 340 may make contact with the memory package P in the shielding space SS. In such a case, the first body surface 341 may make contact with the memory package P and the second body surface 342 may make the second flat surface 121s of the upper case 120, thereby providing a heat dissipation path between the memory package P and the upper case 120. Thus, the operation heat of the memory package P may be dissipated outwards through the body 340, thereby improving the heat dissipation characteristics of the electronic device.

For example, the upper case 120, the body 340 and the vertical plates 310 may have the same conductive materials and may be integrally combined with each other in one body. For example, the body 340 and the vertical plates 310 may be integrally formed together with the upper case 120 in a single mold process.

Figure 6A:
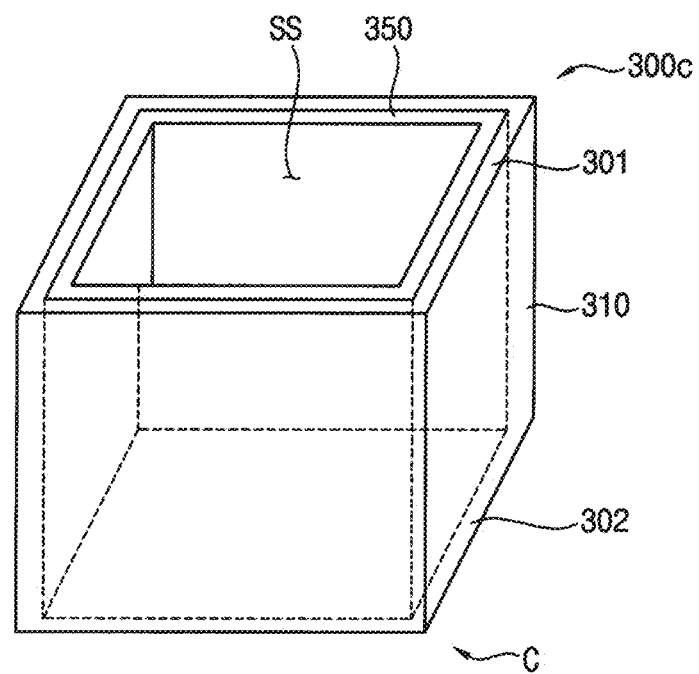
FIG. 6A is a perspective view illustrating a third modification of the electromagnetic shielding member shown in FIG. 3A.
Figure 6B:
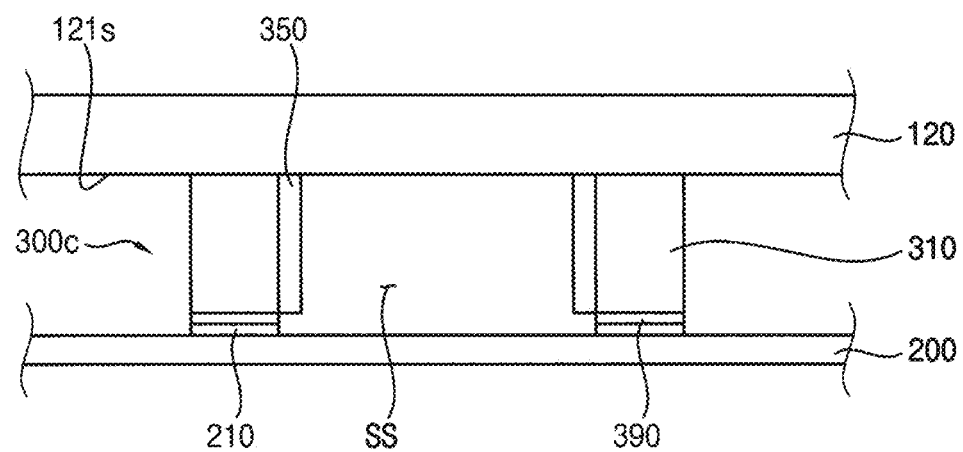
FIG. 6B is a cross sectional view illustrating the combination of the third modified electromagnetic shielding member shown FIG. 6A and the board shown in FIG. 1.

FIG. 6A is a perspective view illustrating a third modification of the electromagnetic shielding member shown in FIG. 3A and FIG. 6B is a cross sectional view illustrating the combination of the third modified electromagnetic shielding member shown FIG. 6A and the board shown in FIG. 1. The third modified electromagnetic shielding member 300c in FIG. 6A may have substantially the same structures as the electromagnetic shielding member 300 shown in FIGS. 3A and 3B, except for a total reflection layer vertically arranged on the vertical plates 310 and defining the shielding space SS. Thus, in FIGS. 6A and 6B, the same reference numerals denote the same elements in FIGS. 3A and 3B.

Referring to FIGS. 6A and 6B, the third modified electromagnetic shielding member 300c may include a total reflection layer 350 vertically arranged on the vertical plates 310 and defining the shielding space SS. Thus, when some of the specific electromagnetic waves may refracted from the vertical plate 310 into the shielding space SS, the refracted electromagnetic waves may be totally reflected out from the total reflection layer 350, thereby reducing or preventing the radiation of the specific electromagnetic waves into the shielding space SS of the third modified electromagnetic shielding member 300c.

Most of the specific electromagnetic waves may be reflected from the vertical plates 310 and the rest specific electromagnetic waves may be refracted on the vertical plates 310 into the shielding space SS. Most of the refracted electromagnetic waves may be converted into the induced currents that may be discharged through the grounding line 210.

However, some of the refracted electromagnetic waves may not be converted into the induced currents and may remain in the vertical plate 310 as residual electromagnetic waves. The residual electromagnetic waves may be transferred into the shielding space SS and the electronic device may be damaged by the residual electromagnetic waves.

In such a case, the total reflection layer 350 may totally reflect the residual electromagnetic waves out of the shielding space SS and the electronic device may be more sufficiently protected from the residual electromagnetic waves.

According to the housing for receiving electronic devices, the housing 500 may include the case 100 receiving the board 200 and the electronic device mounted on the board 200 and the electromagnetic shielding member 300 that may be integrally combined with the case in one body and enclosing the electronic device on the board 200.

Thus, although the specific electromagnetic waves may be generated after the manufacture of the electronic device, the electronic device may be sufficiently protected from the specific electromagnetic waves that may be selectively and specifically generated in accordance with the operation environments, operation requirements and configurations of the electronic device. The system manufacturer may form the case 100 to which the electromagnetic shielding member 300 may be embedded. Thus, the system manufacturer may buy the electronic devices, which are sufficiently protected from the expected electromagnetic waves, from the device manufacturer and may be mounted on the board 200 in the case 100. The electromagnetic shielding member 300 may be arranged around the electronic device which is vulnerable to the specific electromagnetic waves and the vulnerable device may be received in the shielding space SS of the electromagnetic shielding member 300.

Accordingly, the electronic device may be sufficiently protected from the unexpected electromagnetic waves without any further shielding processes to the board 200 and the electronic devices.

In addition, a plurality of the recesses R may be arranged at an end portion of the electromagnetic shielding member 300 without deterioration of the electromagnetic shielding characteristics, to thereby improving the space efficiency of the board 200 in the housing 500. The size of the recess R may be determined in view of the wavelength of the specific electromagnetic waves. Further, the operation heat of the electronic device may also be dissipated outwards from the shielding space SS through the recess R, thereby improve the heat dissipation characteristics.

Figure 7:
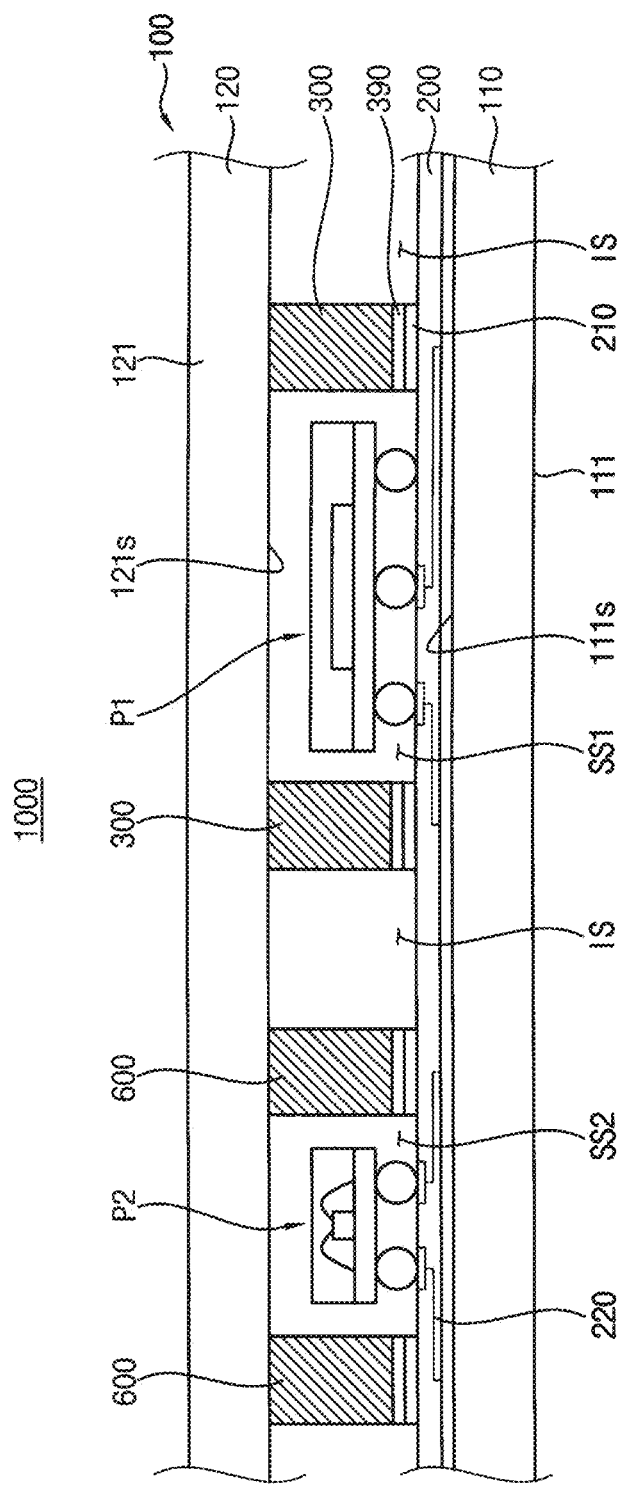
FIG. 7 is a cross sectional view illustrating an electronic system having the housing shown in FIGS. 1 to 3B.

FIG. 7 is a cross sectional view illustrating an electronic system having the housing shown in FIGS. 1 to 3B. In FIG. 7, the electronic system may include at least one electronic device received in the housing 500 shown in FIGS. 1 to 3B. Thus, in FIG. 7, the same reference numerals denote the same elements of FIGS. 1 to 3B.

Referring to FIG. 7, an electronic system 1000 in accordance with an example embodiment of the present inventive concepts may include a case 100 having a lower case 110 and an upper case 120, a circuit board 200 having a grounding line 210 and a connection line 220, a plurality of devices P1 and P2 arranged on the circuit board 200 and/or at least an electromagnetic shielding member 300 and 600 enclosing the devices P1 and P2 and protecting the devices P1 and P2 from electromagnetic waves.

For example, the case 100 may include a 3-dimensional structure having the inner space IS in which the circuit board 200 may be received and may have sufficient strength and/or rigidity for protecting the circuit board 200 from external forces. The 3-dimensional structure may have various shapes and configurations in accordance with the requirements and configurations of an electronic system having the housing 500. For example, the 3-dimensional structure may be shaped into a cylinder structure or a polygonal prism structure.

The case 100 may include the lower case 110 to which the circuit board 200 may be secured and the upper case 120 detachably combined to the lower case 110 such that the inner space IS may be defined by the lower case 110 and the upper case 120.

The lower case 110 may include the first plate 111 having the first flat surface 111s and the first sidewall (not shown) protruding from the first plate 111 upwards and the upper case 120 may include the second plate 121 having the second flat surface 121s and the second sidewall 122 protruding from the second plate 121 downwards. The lower case 110 and the upper case 120 may be combined with each other in such a configuration that the first flat surface 111s may face the second flat surface 121s and the first sidewall may be combined to the second sidewall 122. Thus, the lower case 110 and the upper case 120 may be combined into the case 100 and the space defined by the first and the second flat surfaces 111s and 121s and by the first sidewall and the second sidewall 122 may be provided as the inner space IS of the case 100. The case 100 may have substantially the same structures as the case 100 shown in FIGS. 1 to 3B.

The circuit board 200 may include an insulation substrate having a plurality of electric circuits such as a power line (not shown), at least a grounding line 210 and a plurality of connection lines 220, so various signals such as a power signal, grounding signals and data signals may be transferred through the circuit board 200. For example, the circuit board 200 may include a printed circuit board (PCB).

In example embodiments, a plurality of the grounding lines 210 may be arranged on the circuit board 200 in such a configuration that the devices P1 and P2 may be individually enclosed by the respective grounding line 210 and each device P1 or P2 may be electrically separated from one another. In addition, the separated devices P1 and P2 may be electrically connected with one another by the connection line 220. The connection lines 220 may be arranged in the circuit board 200 and may be connected to each device P1 or P2, so that the devices P1 and P2 may be electrically connected to one another in spite of the separation by the grounding line 210.

The devices P1 and P2 may be mounted on the circuit board 200 and may include various devices such as passive devices and active devices. For example, a plurality of semiconductor memory packages such as DRAM devices and NAND memory devices and various logic devices may be mounted on the circuit board 200. The passive devices may include a controller chip for controlling the memory packages and the logic chip and a capacitor. The active devices and the passive devices may be systematically organized into a single device P1 or P2. A plurality of the devices each of which may include at least an active device and at least a passive device may be arranged on the circuit board 200 and may be systematically connected with one another by the connection line 220. Thus, the electronic system 1000 may include a plurality of devices P1 and P2 that may be systematically organized and electrically connected with one another.

A plurality of the electromagnetic shielding members 300 and 600 may be arranged along the grounding line 210 between the lower case 110 and the upper case 120 in such a configuration that each of the devices P1 and P2 may be individually enclosed by the respective electromagnetic shielding member 300 or 600 and each of the devices P1 and P2 may be received in the respective shielding space SS1 or SS2.

For example, a first electromagnetic shielding member 300 may be arranged along the grounding line 210 in such a configuration that a first device P1 may be enclosed by the first electromagnetic shielding member 300. Thus, the first electromagnetic shielding member 300 may provide a first shielding space SS1 receiving the first device P1 and the first device P1 may be sufficiently protected from the unexpected or specific electromagnetic waves by the first electromagnetic shielding member 300.

The first electromagnetic shielding member 300 may be embedded to the upper case 120 and may protrude from the second flat surface 121s of the upper case 120. When the upper case 120 may be combined to the lower case 110, the first electromagnetic shielding member 300 may automatically make contact with the grounding line 210 to thereby form the first shielding space SS1 defined by the first electromagnetic shielding member 300 and the first and the second flat surfaces 111s and 121s.

The first electromagnetic shielding member 300 may have substantially the same structures as the electromagnetic shielding member 300 described in detail with references to FIGS. 1 to 3B.

A second electromagnetic shielding member 600 may also be arranged along the grounding line 210 in such a configuration that a second device P2 may be enclosed by the second electromagnetic shielding member 600. Thus, the second electromagnetic shielding member 600 may provide a second shielding space SS2 receiving the second device P2 and the second device P2 may be sufficiently protected from the unexpected or specific electromagnetic waves by the second electromagnetic shielding member 600.

The second electromagnetic shielding member 600 may also be embedded to the upper case 120 and may protrude from the second flat surface 121s of the upper case 120. When the upper case 120 may be combined to the lower case 110, the second electromagnetic shielding member 600 may automatically make contact with the grounding line 210 together with the first electromagnetic shielding member 300, to thereby form the second shielding space SS2 defined by the second electromagnetic shielding member 600 and the first and the second flat surfaces 111s and 121s.

The second electromagnetic shielding member 600 may also have substantially the same structures as the electromagnetic shielding member 300 described in detail with references to FIGS. 1 to 3B. Thus, any detailed descriptions on the first and the second electromagnetic shielding members 300 and 600 will be omitted hereinafter.

While example embodiments disclose the first and the second electromagnetic shielding members 300 and 600 enclosing the first and the second devices P1 and P2, any further electromagnetic shielding member may also be provided with the electronic system 1000 as long as further devices requires the electromagnetic shielding against the unexpected and specific electromagnetic waves.

The electromagnetic shielding members 300 and 600 may also be modified as described in detail with references to FIGS. 4A to 6B. Thus, the electromagnetic shielding members 300 and 600 may also include the recesses R and protrusions 320 at an end portion of the vertical plate 310, the body 340 (for example, a flat block) interposed between the vertical plate 310 and the upper case 120 and the total reflection layer 350 on the surface of the vertical plate 310. Particularly, the width w and the depth d of the recess R may be determined by the equation (1) and (2).

According to example embodiments of the electronic system 1000, the circuit board 200 having a plurality of the devices P1 and P2 may be positioned in the case 100 and the electromagnetic shielding members 300 and 600 may be embedded to the case 100 in one body in such a configuration that the electromagnetic shielding members 300 and 600 may individually enclose the devices P1 and P2 with the respective shielding space SS. The electromagnetic shielding members 300 and 600 may be automatically arranged along the grounding line 210 when the upper case 110 may be combined to the lower case 110.

Thus, although the unexpected electromagnetic waves may be generated after the manufacture of the devices P1 and P2 in a test process to the electronic system 1000, the devices P1 and P2 may be sufficiently protected from the specific electromagnetic waves that may be selectively and specifically generated in accordance with the operation environments, operation requirements and configurations of the electronic system. Accordingly, the devices P1 and P2 may be sufficiently protected from the unexpected electromagnetic waves in the test to the electronic system 1000 just by combining the lower case 110 and the upper case 120 without any further shielding processes to the board 200 and the devices P1 and P2.

Figure 8:
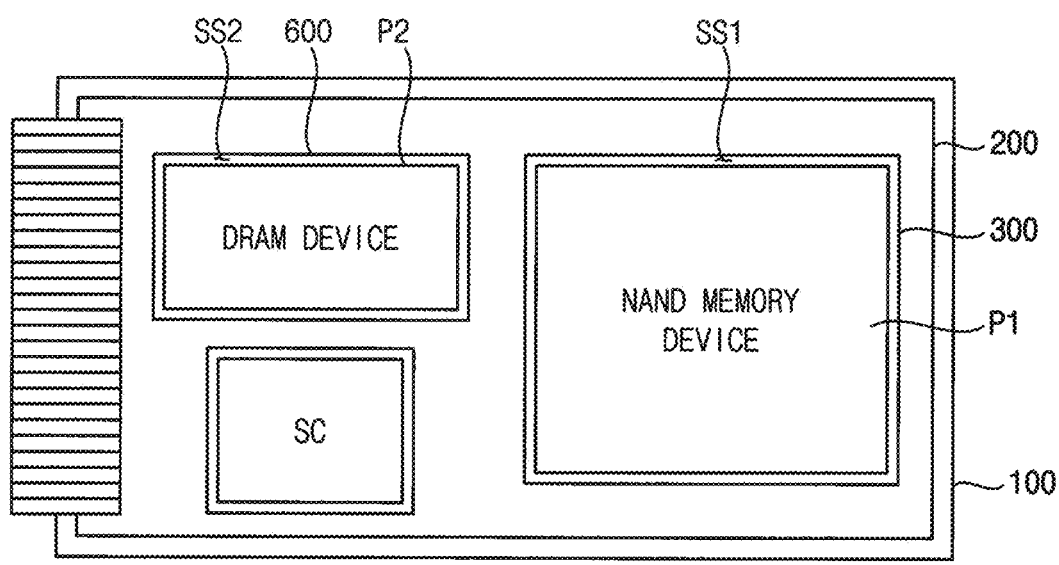
FIG. 8 is a plan view illustrating a schematic structure of a server system having a solid state drive (SSD) in accordance with an example embodiment of the present inventive concepts.

FIG. 8 is a plan view illustrating a schematic structure of a solid state drive (SSD) in accordance with an example embodiment of the present inventive concepts. In FIG. 8, the SSD may be provided as an embodiment of the electronic system 1000 shown in FIG. 7. Thus, in FIG. 8, the same reference numerals denote the same elements of the electronic system shown in FIG. 7.

Referring to FIG. 8, the SSD 1000 may include the case 100, the circuit board 200 on which the NAND memory device P1, the DRAM device P2 and the controller chip SC for controlling the NAND memory device P1 and the DRAM device P2, and the first and second electromagnetic shielding members 300 and 600 for individually enclosing the NAND memory device P1 and/or the DRAM device P2 with the shielding spaces SS1 and SS2.

The NAND memory device P1, the DRAM memory device P2 and the controller chip SC may be manufactured through a semiconductor manufacturing process, a chip test and a package test and an electromagnetic compatibility test. Then, the NAND memory device P1 and the DRAM memory device P2 may be mounted on the circuit board 200 together with the controller SC and the board 200 may be covered by the case 100, thereby forming a storage device as the solid state drive (SSD). Then, an electrostatic discharge (ESD) test may be conducted to the SSD in such a way that a test signal may be applied to the SSD 1000 from an ESD gun. In such a case, radiated noises are unexpectedly generated as the unexpected electromagnetic waves from the ESD gun when driving the ESD gun for generating the test signal. The radiated noises in the ESD test to the SSD 1000 cannot be included in the electromagnetic compatibility test to each component electronic device of the SSD 1000 and the NAND memory device P1, the DRAM memory device P2 and the controller chip SC may be damaged by the radiated noises in the ESD test.

Thus, as the electromagnetic damages to the component devices of the SSD 1000 by the radiated noises selectively occurs in individual operation environments and requirements of the SSD, the electromagnetic shielding member for shielding the radiated noises cannot be provided with the NAND memory device P1, the DRAM memory device P2 and the controller chip SC in standard semiconductor manufacturing processes or in standard PCB manufacturing processes.

However, according to example embodiments, the electromagnetic shielding members 300 and 600 for shielding the radiated noises of the ESD gun may be integrally provided with the case 100 in one body in the molding process for forming the case 100 in such a way that the electromagnetic shielding members 300 and 600 may individually enclose the NAND memory device P1 and the DRAM device P2. The controller chip SC may also be enclosed by the additional electromagnetic shielding member.

As the case 100 for the SSD 1000 and the electromagnetic shielding members 300 and 600 may be formed together by a single molding process regardless of the SSD, the electromagnetic damages caused by the unexpected and specific electromagnetic waves such as the radiated noises of the ESD gun may be sufficiently reduced or prevented without any shielding processes to the NAND memory device P1, the DRAM device P2, the controller chip SC and the circuit board 200.

When the upper case 120 to which the electromagnetic shielding members 300 and 600 may be embedded may be combined with the lower case 110, the electromagnetic shielding members 300 and 600 may be automatically arranged along the grounding line 210 to thereby form the shielding space SS1 and SS2 receiving the NAND memory device P1 and the DRAM device P2, respectively. A further shielding space may also be formed around the controller chip SC. Thus, the NAND memory device P1, the DRAM device P2 and the controller chip SC may be sufficiently protected from the radiated noises.

The electromagnetic shielding members 300 and 600 may be modified as described in detail with references to FIGS. 4A to 6B. Thus, the electromagnetic shielding members 300 and 600 may also include the recesses R and protrusions 320 at an end portion of the vertical plate 310, the body 340 (for example, a flat block) interposed between the vertical plate 310 and the upper case 120 and the total reflection layer 350 on the surface of the vertical plate 310. Particularly, the width w and the depth d of the recess R may be determined by the equation (1) and (2).

According to example embodiments of the present inventive concepts, the circuit board having a plurality of the devices may be positioned in the case and the electromagnetic shielding members may be embedded to the case in one body in such a configuration that the electromagnetic shielding members may individually enclose the devices with the respective shielding spaces. The electromagnetic shielding members may be automatically arranged along the grounding line on the board when the upper case may be combined to the lower case.

Accordingly, the devices may be sufficiently protected from the unexpected electromagnetic waves in the test to the electronic system just by combining the lower case and the upper case without any further shielding processes to the board and the devices.

In addition, a plurality of the recesses may be arranged at an end portion of the electromagnetic shielding member without deterioration of the electromagnetic shielding characteristics, thereby improving the space efficiency of the board in the electronic system. The size of the recess may be determined in view of the wavelength of the specific electromagnetic waves. Further, the operation heat of the devices on the board may also be dissipated outwards from the shielding space through the recess, thereby improve the heat dissipation characteristics of the electronic system.

The foregoing is illustrative of example embodiments and is not to be construed as limiting thereof. Although example embodiments have been described, those skilled in the art will readily appreciate that many modifications are possible in the example embodiments without materially departing from the novel teachings and advantages of the present invention. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A housing configured to receive electronic devices, comprising:
    a case having an inner space in which a board is received such that at least a grounding line extends on the board; and
    an electromagnetic shielding member integrally formed on an inner surface of the case such that the electromagnetic shielding member is in contact with the grounding line to thereby provide a shielding space defined by the board and the electromagnetic shielding member, the shielding space being shielded from electromagnetic waves by the electromagnetic shielding member,
    wherein the case includes a lower case to which the board is secured and an upper case detachably combined with the lower case to define the inner space and on which the electromagnetic shielding member is integrally formed,
    wherein the electromagnetic shielding member includes sidewalls forming a perimeter surrounding the shielding space and spaced apart from the case,
    wherein the electromagnetic shielding member includes a cylinder structure extending from the upper case, and
    wherein the cylinder structure has a plurality of recesses and protrusions that are alternatively arranged along a circumferential line at an end portion opposite to the upper case such that the cylinder structure is discontinuously in contact with the grounding line at the protrusions and the shielding space is provided as an open space.

2. The housing of claim 1, wherein the plurality of recesses includes a width along the circumferential line and a depth along a height of the cylinder structure in a range of $1/50$ times to $1/20$ times a wavelength of the electromagnetic waves.

3. The housing of claim 1, wherein the grounding line is discontinuously arranged along the circumferential line of the cylinder structure such that the protrusions are in contact with grounding points alternately with recesses and the board corresponding to the recesses is exposed without the grounding line.

4. The housing of claim 1, wherein at least one of a passive device and a wiring line is arranged on the board corresponding to the plurality of recesses of the cylinder structure.

5. The housing of claim 1, wherein the electromagnetic shielding member further includes a plate body between the cylinder structure and the inner surface of the upper case such that the cylinder structure is in contact with a peripheral portion of the plate body.

6. The housing of claim 1, further comprising a conductive adhesive between the grounding line and the electromagnetic shielding member such that the electromagnetic shielding member is conductively adhered to the grounding line by the conductive adhesive.

7. An electronic system comprising:
a case having a lower case and an upper case detachably combined with the lower case;
a circuit board in an inner space of the case and secured to the lower case such that at least one grounding line and at least one connection line are provided with the circuit board;
a plurality of devices arranged on the circuit board such that each device is separated from one another by the at least one grounding line and is connected with one another by the at least one connection line; and
at least one electromagnetic shielding member integrally formed on the upper case such that the electromagnetic shielding member is in contact with the at least one grounding line around the plurality of devices to thereby provide a shielding space receiving the plurality of devices, the plurality of devices being protected from electromagnetic waves by the electromagnetic shielding member,
wherein the at least one electromagnetic shielding member includes sidewalls forming a perimeter surrounding the shielding space and spaced apart from the case,
wherein the electromagnetic shielding member includes a cylinder structure extending from an inner surface of the upper case, and
wherein the cylinder structure has a plurality of recesses and ground terminals that are alternately arranged along a circumferential line at the end portion opposite to the upper case such that the cylinder structure is discontinuously in contact with the at least one grounding line on the circuit board and the shielding space is provided as an open space.

8. The electronic system of claim 7, wherein the plurality of recesses include a width along the circumferential line and a depth along a height of the cylinder structure in a range of $1/50$ times to $1/20$ times a wavelength of the electromagnetic waves.

9. The electronic system of claim 7, further comprising a conductive adhesive interposed between the grounding line and the electromagnetic shielding member such that the electromagnetic shielding member is conductively adhered to the grounding line by the conductive adhesive.

10. A housing configured to receive electronic devices, comprising:
a case including,
a lower case to which a circuit board including at least a grounding line and a plurality of electronic devices is secured, and
an upper case detachably combined with the lower case to define an inner space in which the circuit board is received; and
an electromagnetic shielding member integrally provided with the upper case in the inner space of the case and extending toward the circuit board such that the electromagnetic shielding member is configured to be in discontinuous contact with the grounding line to thereby provide an open shielding space defined by the circuit board and the electromagnetic shielding member and communicating with surroundings and the open shielding space is shielded from electromagnetic waves by the electromagnetic shielding member,
wherein at least one of the electronic devices is arranged on the circuit board across the electromagnetic shielding member,
wherein the electromagnetic shielding member includes a cylinder structure having a plurality of recesses and protrusions that are alternately arranged along a circumferential line at an end portion opposite to the upper case such that the grounding line is in contact with the electromagnetic shielding member at the protrusions and at least one of the electronic devices is arranged on the circuit board in at least one of the plurality of recesses.

11. The housing of claim 10, wherein the plurality of recesses includes a width along the circumferential line and a depth along a height of the cylinder structure in a range of $1/50$ times to $1/20$ times a wavelength of the electromagnetic waves.

12. The housing of claim 10, wherein the circuit board corresponding to the plurality of recesses is exposed without the grounding line.

13. The housing of claim 10, wherein at least one of the electronic devices includes a passive device and a wiring line.

* * * * *